United States Patent [19]
Van Liere

[11] Patent Number: 4,908,578
[45] Date of Patent: Mar. 13, 1990

[54] METHOD OF AND DEVICE FOR GENERATING INTERLEAVED MULTIPLE-SLICE MULTIPLE-ECHO PULSE SEQUENCES FOR MRI

[75] Inventor: Filips Van Liere, Eindhoven, Netherlands

[73] Assignee: U.S. Philips Corporation, New York, N.Y.

[21] Appl. No.: 290,075

[22] Filed: Dec. 23, 1988

[30] Foreign Application Priority Data
Dec. 24, 1987 [NL] Netherlands ............ 8703127

[51] Int. Cl.$^4$ ............................................ G01R 33/20
[52] U.S. Cl. ...................................... 324/309; 324/307
[58] Field of Search ............... 324/300, 307, 309, 310, 324/311, 312, 313, 314, 318, 319, 322; 128/653

[56] References Cited
U.S. PATENT DOCUMENTS
4,599,565 7/1986 Hoenninger ............ 324/309
4,717,879 1/1988 Riederer ................ 324/309

Primary Examiner—Michael J. Tokar
Attorney, Agent, or Firm—Thomas A. Briody; Jack E. Haken; Jack D. Slobod

[57] ABSTRACT

MRI utilizes so-called multiple-slice multiple-echo pulse sequences. Pulse sequences are generated in order to produce echo resonance signals in different sub-regions of a body, after which images of the various sub-regions are reconstructed from the resonance signals. The pulse sequences, for example spin echo sequences, are successively generated for the various sub-regions. More than one echo resonance signal can be generated by means of each pulse sequence. In order to reduce the overall measuring time the invention proposes the interleaving of a pulse sequence (ex1, ep11, er11, ep12, er12) for a sub-region with pulse sequences (ep02, er-12, ex2, ep21, er21, er02, ex3, ep31, er31, ep22) for other sub-regions. It is essential that the excitation pulse (ex1), the echo pulses (ep11, ep12) and the echo resonance signals (er11, er12) are phase coherent within a pulse sequence.

16 Claims, 4 Drawing Sheets

METHOD OF AND DEVICE FOR GENERATING INTERLEAVED MULTIPLE-SLICE MULTIPLE-ECHO PULSE SEQUENCES FOR MRI

BACKGROUND OF THE INVENTION

The invention relates to a method of determining a nuclear magnetization distribution from magnetic resonance signals which are generated in a body which is situated in a steady, uniform magnetic field, which magnetic resonance signals are generated in sub-regions of the body by means of selective pulse sequences, in a pulse sequence for generating resonance signals in the sub-region there being excited nuclear spins by application of a selective RF electromagnetic excitation pulse, after which at least one magnetic field gradient which is superposed on the uniform magnetic field is applied, at least one such gradient being variable in amplitude or direction from one pulse sequence to another, there being applied an RF electromagnetic echo pulse in order to generate a resonance signal from the excited nuclear spins, after which the pulse sequences are repeated a number of times for different values of the variable magnetic field gradients and subsequently the nuclear magnetization distribution is determined from the resonance signals generated.

The invention also relates to a device for determining a nuclear magnetization distribution from magnetic resonance signals to be generated in a body, which device comprises means for generating a steady, uniform magnetic field, means for generating selective RF electromagnetic pulses, means for generating at least one magnetic field gradient whose amplitude or direction are variable, and control means for controlling the means for generating the selective RF electromagnetic pulses, means for receiving, detecting and sampling the magnetic resonance signals, and also comprises processing means which include programmed arithmetic means for determining the nuclear magnetization distribution from the sampled resonance signals.

A method and device of this kind are known from U.S. Pat. No. 4,665,367. According to such a method and device, a body to be examined is arranged in a steady, uniform magnetic field $B_0$ whose direction coincides with the z-axis of a stationary cartesian coordinate system (x, y, z). Under the influence of the magnetic field, a small excess of the nuclear spins present in the body are directed in the same way with respect to the theoretically possible saturation value (all nuclear spins) due to thermal movement. From a macroscopic point of view, the small excess is to be considered as a magnetization M of the body or as a slight polarization of the nuclear spins. After the body arranged in the magnetic field has been irradiated by an RF electromagnetic pulse which must have a given frequency, the equilibrium of the magnetization M is disturbed so that it starts to perform a precessional motion about the magnetic field $B_0$. When the processional motion is observed from a cartesian coordinate system (x', y', z') which rotates in the same direction and whose z'-axis coincides with the z-axis of said stationary cartesian coordinate system and when the angular velocity of the cartesian coordinate system rotating in the same direction is chosen to be equal to the angular frequency $\omega$ of the RF electromagnetic pulse, the magnetization M is to be considered to be a vector when the angular frequency $\omega$ of the RF electromagnetic pulse equals the resonance frequency $\omega_0$ of the nuclear spins, which vector moves under the influence of the irradiation in a plane perpendicular to the direction of irradiation. The component of the magnetization M perpendicular to the z-axis, the so-called transverse magnetization, causes a resonance signal after irradiation. For the resonance frequency $\omega_0$, the so-called Larmor equation $\omega_0 = \text{gamma}.B_0$, holds good, where gamma is the gyromagnetic ratio of, for example, protons. The angle of rotation of the magnetization M, and hence the magnitude of the resonance signal, is determined by the area underneath the RF electromagnetic pulse. An RF electromagnetic pulse which rotates the magnetization M through 90° in the stationary coordinate system will be referred to hereinafter as a 90° pulse. After irradiation, the magnetization M will relax with a time constant $T_1$, the so-called longitudinal relaxation time, until is reaches the static of equilibrium. A further time constant is the so-called transverse relaxation time $T_2$, which is the time constant indicating the decay of the transverse magnetization. In practical cases the transverse magnetization decays with a time constant $T_2^*$ which is substantially smaller than $T_2$ due to dephasing under the influence of inevitably present field inhomogeneities. However, within the relaxation with $T_2$ always resonance signals can be obtained by rephasing. By application of magnetic field gradients $G_x$, $G_y$ and $G_z$ on the magnetic field $B_0$, the field directions of said gradients corresponding to that of the magnetic field $B_0$ and their gradient directions extending perpendicularly to one another, a location-dependent magnetic field $B = B_0 + G_x.x + G_y.y + G_z.z$ can be generated. U.S. Pat. No. 4,665,367 describes how resonance signals can be generated in sub-regions of the body by means of selective pulse sequences. Selective pulse sequences are pulse sequences in which excitation pulses occur which excite only the nuclear spins of a sub-region in the presence of a gradient and which do not excite the nuclear spins of other sub-regions. The excitation pulses then cover a range of Larmor frequencies associated with a local field. The gradient which provides selection, together with the RF electromagnetic pulses, is also referred to as the selection gradient (for example $G_z$). FIGS. 3 and 10 of said U.S. Pat. No. 4,665,367 show selective excitation for sub-regions (multiple-slice) and appropriate pulse sequences, respectively. For 16 sub-regions resonance signals are collected while varying the amplitude of one or two magnetic field gradients (for 2D and 3D imaging, respectively). In the present example, 4 resonance signals can be generated in each waiting period required for relaxation of the magnetization to the state of equilibrium. In that case, 4 waiting periods are required for generating a resonance signal for all 16 sub-regions. By repeating the sequence a number of times (for example, 256 times) while varying $G_y$, a sufficient number of resonance signals can be collected for determining, for example for each sub-region, a nuclear magnetization distribution from sampling values of the respective resonance signals by means of, for example 2D Fourier transformation (Fourier zeugmatography). By repeating the sequence also while varying $G_z$, 3D Fourier transformation can be applied in order to determine a 3D nuclear magnetization distribution of the body. It will usually be desirable to form nuclear magnetization distributions of a number of sub-regions (for example, slices) of the body, and also images thereof in which a $T_1$ weighting operation ($T_1$ contrast) and a $T_2$ weighting operation ($T_2$ contrast) are performed. For example, different echo times must then be used for T2 weighting and different pulse sequence repetition times and/or inversion pulses must be used for $T_1$ weighting. The echo time is the period of time expiring between the generating of the excitation pulse and the occurrence of an echo resonance signal in a sequence. In the case of a comparatively long echo time, for example as in the case of $T_2$ weighting, a loss of time is incurred. $T_1$ weighting and $T_2$ weighting together offer a suitable discrimination of tissue in, for example, in vivo measurements.

SUMMARY OF THE INVENTION

It is an object of the invention to provide a method whereby a substantial reduction of the measuring time is achieved.

A method in accordance with the invention is characterized in that RF electromagnetic pulses and magnetic resonance signals in a pulse sequence for generating resonance signals in a sub-region are interleaved in time with RF electromagnetic pulses and magnetic resonance signals in pulse sequences for generating magnetic resonance signals in at least one other sub-region, it being ensured that the excitation pulse and the echo pulses are phase coherent within a pulse sequence. In the case of comparatively long echo times, time intervals which are not necessary for the switching of gradients of a pulse sequence associated with a sub-region are used for generating pulses and gradients of other sub-regions. The method as described in U.S. Pat. No. 4,665,367 can be extended in known manner so as to obtain a method whereby $T_1$-weighted as well $T_2$-weighted images can be made by generating, after the occurrence of the first echo resonance signal, a second echo pulse for generating a second echo resonance signal (multiple-echo) and by reconstructing images from groups of resonance signals generated by means of the first echo pulses and the second echo pulses, respectively. When more than one echo pulse is applied in this manner in order to obtain $T_1$-weighted and $T_2$-weighted images, mainly the intervals succeeding the echo pulses are used. The first echo pulse will then generally succeed the excitation pulse so closely that the interval between the excitation pulse and the first echo pulse of a sequence cannot be used for other sequences. The time required for transverse relaxation will then be used for the interleaving of pulse sequences associated with different sub-regions. By chosing all corresponding echo times of the sub-regions to be equal in the method in accordance with the invention, comparable images are obtained after reconstruction.

It is to be noted that multiple-slice and multiple-echo are separately described in "Principles of MR Imaging", a publication by Philips Medical Systems, November 1984. Multiple-slice—multiple-echo is also described in brief in "Multiple Spin-Echo Imaging with a 2D Fourier Method", by R. Graumann et al, Magnetic Resonance in Medicine 3, pp. 707–721, notably on page 716. It is also to be noted that, for example in U.S. Pat. No. 4,577,152, FIG. 4, first the inversion pulses are given for different sub-regions in so-called inversion recovery measurements, and subsequently the resonance signals are successively generated for the sub-regions by means of 90° pulses. However, no phase coherence is then required between the inversion pulse on the one side and the 90° pulse and the resonance signal on the other side, because the inversion pulse only inverts the magnetization M and does not render it transverse. Therefore, this method does not concern interleaved sequences in the sense of the invention and the resonance signals are consecutively generated.

A preferred version of a method in accordance with the invention is characterized in that, in order to obtain suitable rephasing at echo instants, the gradient waveforms are the same for all sub-regions, the magnetic resonance signals being obtained by the phase-coherent variation of the frequency of the excitation pulse and of the echo pulses in the pulse sequences of the respective sub-regions. When the gradient $G_x$ applied during the measurement and sampling of the resonance signal also has the same sign and the same form for all resonance signals in a sequence, the conditions in which the various resonance signals are obtained from a sub-region are constant and hence comparable.

A version of a method in accordance with the invention is characterized in that in the pulse sequences the excitation pulse is preceded by an inversion pulse. An inversion recovery pulse sequence is thus obtained.

Further versions of methods in accordance with the invention are characterized in that either for the phase encoding of the nuclear spins in a first direction the amplitude of a first gradient is varied during the repetition of the pulse sequences, or for the phase encoding of the nuclear spins in the first and a second direction the amplitude of the first and a second gradient is varied, the amplitude of one of said first and second gradients being varied per pulse sequence, or the amplitude of the first and a third gradient is simultaneously varied during the repetition of the pulse sequences, or in the pulse sequences the amplitude of the first and the third gradient is simultaneously varied during the repetition of the pulse sequences; this is subsequently repeated while varying the amplitude of the second gradient. Thus, methods are achieved with either 2D Fourier transformation or 3D Fourier transformation, or 2D projection reconstruction or 3D projection reconstruction.

A device in accordance with the invention is characterized in that the processing means also comprise programmed arithmetic means for controlling the control means so as to interleave in time RF electromagnetic pulses and magnetic resonance signals in a pulse sequence for generating magnetic resonance signals in a sub-region with RF electromagnetic pulses and magnetic resonance signals in pulse sequences for generating magnetic resonance signals in at least one other sub-region, the device comprising a phase-continuous synthesizer for the phase coherent generating of RF electromagnetic pulses in order to maintain phase coherence between an excitation pulse, echo pulses and echo resonance signals of a pulse sequence associated with a sub-region of the body. The method in accordance with the invention can be performed by means of such a device.

BRIEF DESCRIPTION OF THE DRAWING

The invention will be described in detail hereinafter with reference to a drawing; therein.

DETAILED DESCRIPTION OF THE PREFERRED EMBODIMENTS

Figure 1:
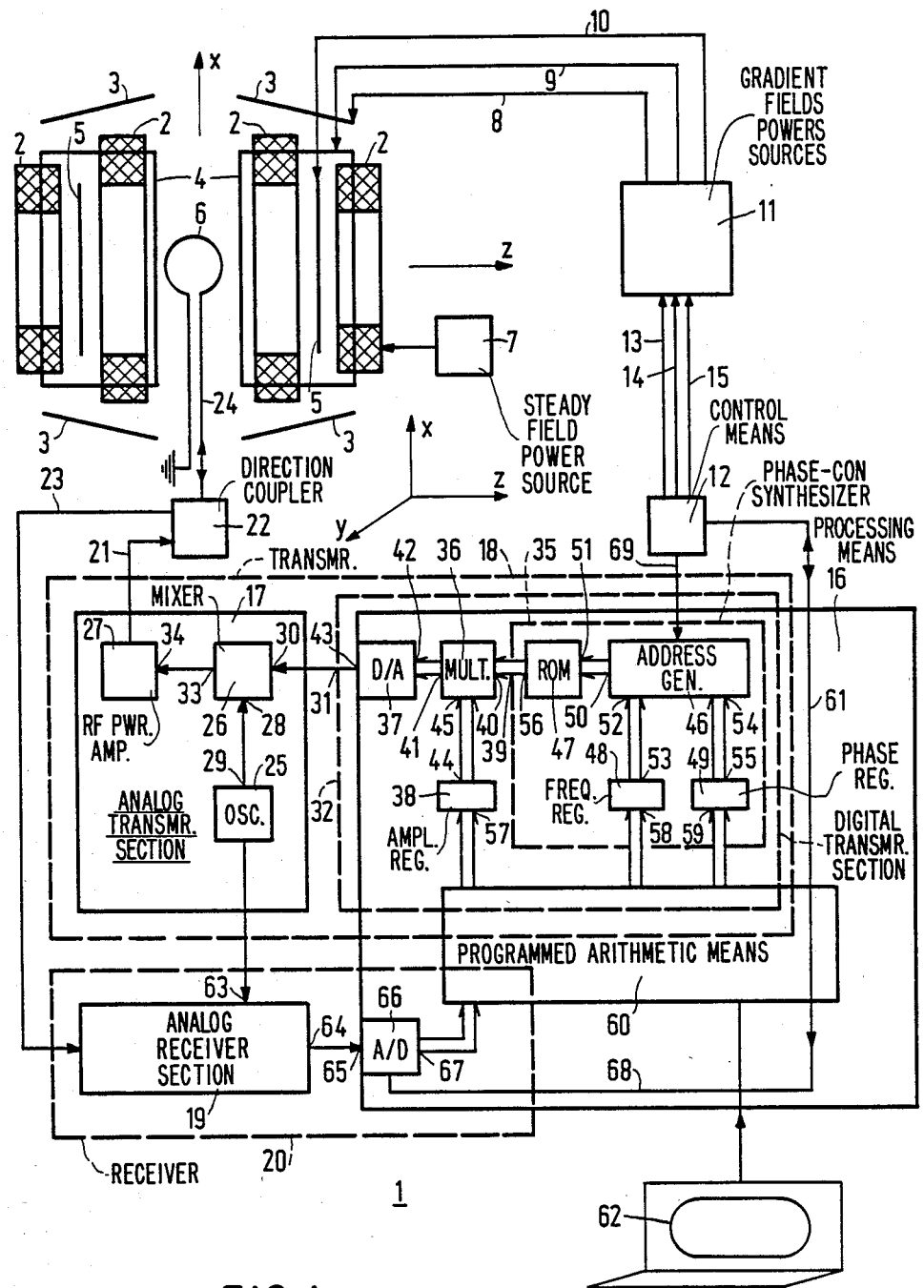
FIG. 1 diagrammatically shows an MRI device for executing the method in accordance with the invention.

FIG. 1 diagrammatically shows an MRI device 1 for performing the method in accordance with the invention, comprising magnet coils 2 for generating a steady, uniform magnetic field $B_0$, gradient magnet coils 3 for generating a magnetic field gradient $G_x$, gradient magnet coils 4 for generating a magnetic field gradient $G_y$, gradient magnet coils 5 for generating a magnetic field gradient $G_z$, and a transmitter/receiver coil 6 for transmitting RF electromagnetic pulses to the body and for receiving magnetic resonance signals from the body, respectively. When the magnet coils 2 are constructed as resistance magnets, they are powered by a DC power supply source 7. When the magnet coils 2 are constructed as permanent magnets, of course, the DC power supply source 7 is absent. The magnet coils 2 can also be constructed as superconducting magnets. During execution of the method, the body is arranged within the magnet coils 2. The gradient magnet coils 3, 4 and 5 are powered, via respective power supply lines 8, 9 and 10, by a controllable power supply source 11 which is controlled by control means 12. The magnetic field gradients which are superposed on the magnetic field $B_0$ can be independently generated. To this end there are provided three control lines 13, 14 and 15 between the control means 12 and the controllable power supply source 11. In the embodiment shown, the spatial arrangement of the gradient coils is such that the field direction of the magnetic field gradients $G_x$, $G_y$ and $G_z$ coincides with the direction of the magnetic field $B_0$ and that the gradient directions extend perpendicularly to one another as denoted by three mutually perpendicular axes x, y and z in FIG. 1. The control means 12 are coupled to processing means 16 via a number of lines. The processing means 16 are coupled to an analog transmitter section 17 of a transmitter 18 for transmitting RF electromagnetic pulses and to an analog receiver section 19 of a receiver 20 for receiving, detecting and sampling magnetic resonance signals. The analog transmitter section 17 is coupled, via a line 21, to a directional coupling device 22 which is coupled, via a line 23, to the analog receiver section 19. The transmitter/receiver coil 6 is coupled, via a line 24, to the directional coupling device 22. The transmitter/receiver coil 6 can alternatively be constructed as a separate transmitter coil and a separate receiver coil. In that case the directional coupling device 22 is dispensed with. The analog transmitter section 17 comprises a transmission frequency oscillator 25, a transmission frequency mixing stage 26 and an RF power amplifier 27. The transmission frequency mixing stage 26 is coupled, by way of an input 28, to an output 29 of the transmission frequency oscillator 25 and is also coupled, by way of an input 30, to an output 31 of a digital transmitter section 32 of the transmitter 18. Furthermore, via an output 33 the transmission frequency mixing stage 26 is coupled to an input 34 of the RF power amplifier 27. The digital transmitter section 32 is included in the processing means 16, but can alternatively be constructed as a separate digital unit. The analog transmitter section 17 and at least a part of the digital transmitter section 32 may also be accommodated in one unit. However, this is irrelevant for the operation of the device 1. The digital transmitter section 32 comprises a frequency-continuous synthesizer 35, a multiplier device 36, a digital-to-analog converter 37, and a register 38 for the storage of digital amplitude information. The phase-continuous synthesizer 35 is coupled, by way of an output 39, to an input 40 of the multiplier device 36 which is coupled, by way of an output 41, to an input 42 of the digital-to-analog converter 37. The digital-to-analog converter 37 is coupled, by way of an output 43, to the input 31 of the digital transmitter section 32. The register 38 is coupled, by way of an output 44, to an input 45 of the multiplier device 36. The phase-continuous synthesizer 35 comprises an address generator 46, a read-only memory 47, a register 48 for the storage of digital frequency information, and a register 49 for the storage of digital phase information. The address generator 46 is coupled, by way of an output 50, to an input 51 of the ROM 47. Via an input 52, the address generator is also coupled to an output 53 of the register 48 and, by way of an input 54, to an output 55 of the register 49. The ROM 47 is coupled, by way of an output 56, to the output 39 of the phase-continuous synthesizer 35. The registers 38, 48 and 49 are coupled, by way of respective inputs 57, 58 and 59, to programmed arithmetic means 60. The programmed arithmetic means are also coupled to the control means 12, via a line 61, and to a display screen 62 for the display of an image of the nuclear magnetization distribution. The analog receiver section 19 is coupled, by way of an input 63, to the transmission frequency oscillator 25 and, by way of an output 64, to an input 65 of the processing means 16. The analog receiver section which is not described in detail herein comprises a conventional detector circuit (not shown). For a more detailed description of a demodulator based on (double) phase-sensitive detection, reference is made, for example to an article by P. R. Locher "Proton NMR Tomography", Philips Technical Review, Vol. 41, 1983/84, No. 3, pp. 73–88. It is to be noted that the transmitter/receiver described therein does not comprise a phase-continuous synthesizer. The processing means 16 also comprise at least one analog-to-digital converter. FIG. 1 shows an analog-to-digital converter 66 whose input is formed by the input 65 of the processing means and which is coupled, by way of an output 67, to the programmed arithmetic means 60. The analog-to-digital converter 66 is controlled by the control means 12, via a control line 68. For a more detailed description of a so-called digital transmitter/receiver comprising a phase-continuous synthesizer, reference is made to the commonly owned allowed U.S. patent application Ser. No. 196,534, filed May 19, 1988 prepublished Netherlands Patent Application No. . . . (PHN 12.134). European Patent Application EP 0 165 057 also describes such a digital transmitter/receiver. The method in accordance with the invention can be performed only if the device 1 comprises a phase-continuous synthesizer; however, the detection may be phase-sensitive or phase-insensitive. The generating of a resonance signal in the body by means of an RF electromagnetic pulse and the described MRI device will now described. The ROM 47 contains a sinusoidal function which is stored in digital form in a table at successive memory locations. The table contains, for example 1024 values of one period of the sinusoidal signal. When the ROM is passed through cyclically at a uniform speed, a periodic sinusoidal signal appears on the output 56 thereof. The address generator 46 generates addresses for the ROM 47. At successive addresses (and with a constant clocking frequency (clock means for the clocking out of table values are not shown), the minimum frequency is reached. When a higher frequency is desirable, the ROM memory must be passed through in larger steps (for example, each time 1, 2, 3, ... addresses are skipped). It will be apparent that the steps may not be too large, because an analog sinusoidal signal must be reconstructed by filtering from the table values obtained. The known Shannon theorem must then be satisfied. The contents of the register 48 are decisive as regards the frequency of the sinusoidal signal (jumps are feasible in the table). Because the programmed means 60 can load registers 48 and 49 so that the address generator 46 can form the exact address at any instant, phase coherence can be simply maintained when the frequency is varied. In this respect reference is also made to a phase-continuous synthesizer known as "Wavetek", model 5155A. The register 38 contains amplitude information, which means in this case that the digital number in the register 38 is a measure for the amplitude of the sinusoidal signal present on the output of the multiplier device 36. When the control means 12 enable, for example the address generator 46 via an enable line 69, the output of the digital-to-analog converter 37 will carry a sinusoidal signal whose amplitude, frequency and phase are determined by the contents of the registers 38, 48 and 49. By continuously varying the contents of the register 38, the amplitude of the sinusoidal signal can be modulated in order to generate pulses and a given bandwidth can be imparted to the pulses. For example, frequencies between 100 and 700 kHz are generated. In the transmission frequency mixing stage 26, the (modulated) sinusoidal signal on the output 43 of the digital-to-analog converter 37 is mixed with the signal of the transmission frequency oscillator 25 (this oscillator may be, for example a PLL (phase locked loop) oscillator). The output 33 of the transmission frequency mixing stage 26 will carry a pulse having such a frequency contents that it is suitable for exciting nuclear spins present in a steady magnetic field (for example, when the body contains protons, a proton resonance signal can be generated; for example, when the field strength of the magnetic field $B_0$ amounts to 1.5 T, the resonance frequency of protons amounts to 63.86 MHz). When a signal of, for example 63.56 MHz is generated in the transmission frequency oscillator 25, proton resonance will be obtained on the output 53 for a signal of 300 kHz when use is made of a 1.5 T MRI system. By generating a signal having a given bandwidth with respect to an iso centre in the presence of a magnetic field gradient $G_z$ superposed on the magnet field $B_0$, a sub-region (for example, a slice) of the body can be selectively excited by means of a selective pulse sequence. The isocentre is the point within the magnet coils 2 in which exactly the field strength $B_0$ occurs when all magnetic field gradients are activated (in the case of ideal magnet coils 2). The generated pulse is amplified by means of the power amplifier 27 and is applied, via the directional coupling device 20, to the transmitter/receiver coil 6, so that proton resonance signals are generated in the present example. While varying magnetic field gradients, a large number of resonance signals are generated. The generated resonance signals are received, detected and sampled in known manner and from the sampled signals a nuclear magnetization distribution is determined in known manner, for example by Fourier transformation. Subsequently, an image of the nuclear magnetization distribution is displayed on the display screen 62 by converting, for example signal values into grey tones.

Figure 2:
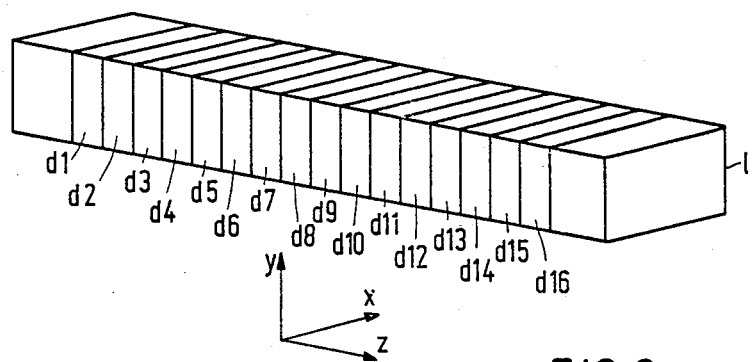
FIG. 2 shows a body with a subdivision into sub-regions.

FIG. 2 shows a body 1 with a sub-division into sub-regions, for example "slices" d1 to d16.

Figure 3:
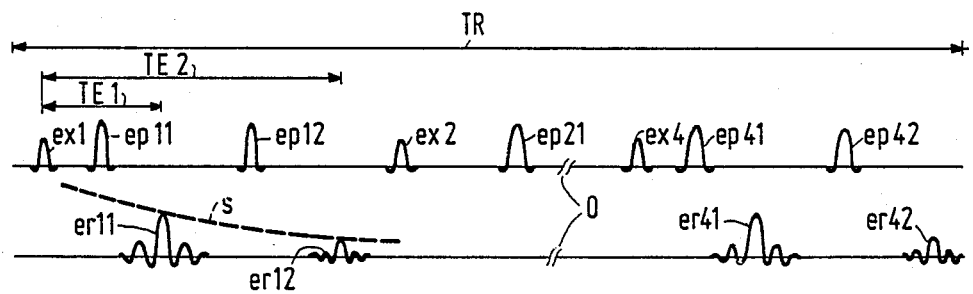
FIG. 3 shows a multiple-slice multiple-echo pulse sequence.
Figure 5:
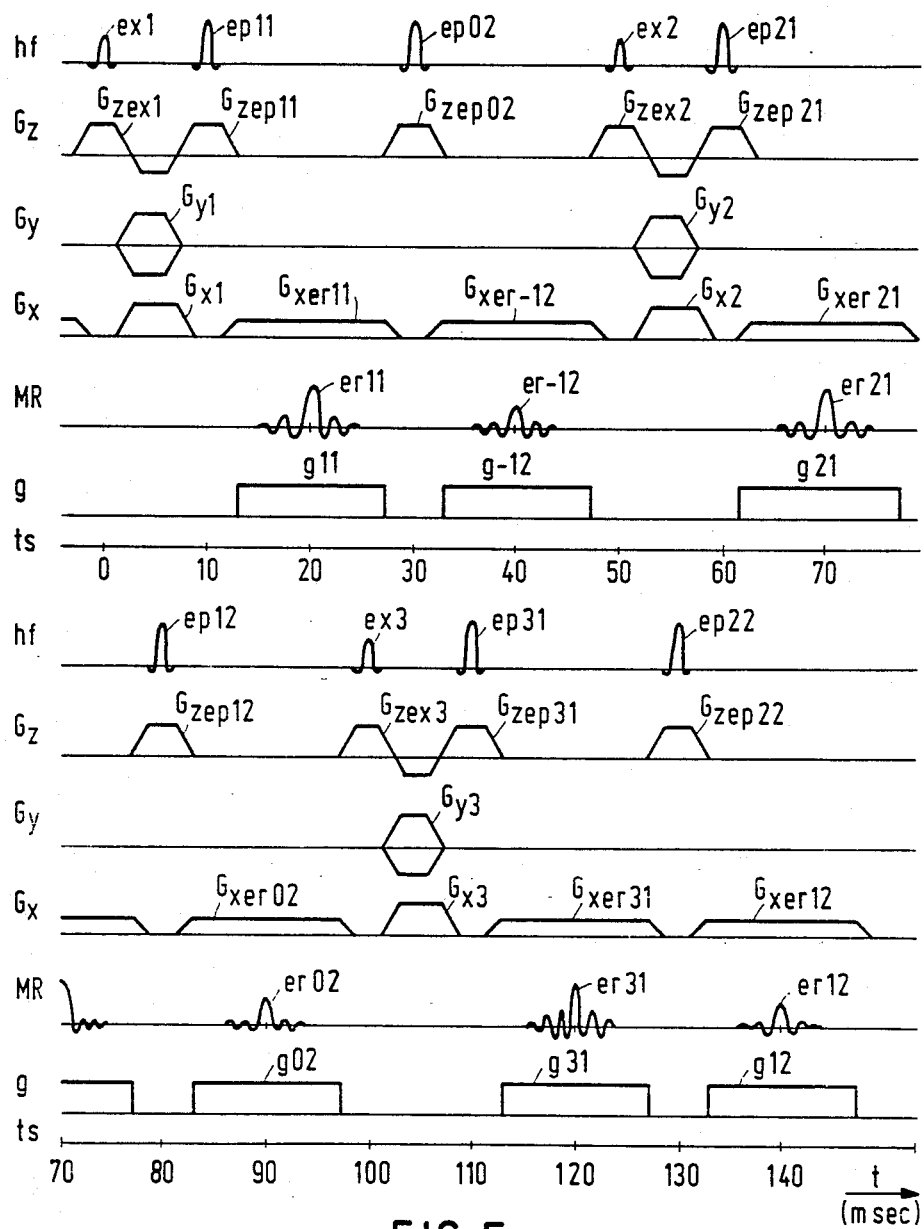
FIG. 5 shows time-interleaved pulse sequences in accordance with the invention for two echo resonance signals per pulse sequence, and FIG. 6 diagrammatically shows some further time-interleaved pulse sequences in accordance with the invention.

In FIG. 3 pulses and echo resonance signals of known multiple-slice multiple-echo pulse sequences for the selective generating of echo resonance signals in the slices d1 to d16 are plotted as a function of time T. The associated gradients are not shown. FIG. 5 of the U.S. Pat. No. 4,665,367 shows so-called spin echo pulse sequences in which field gradients are also shown for 2D Fourier zeugmatography. The description of FIG. 3 of the present application will now be continued. Using the pulse sequence shown, nuclear spins of other slices can be excited within a waiting period TR for the return to a state of equilibrium of the magnetization M of a slice after the excitation thereof. First, for example slice d1 is excited by means of a selective excitation pulse ex1 (the pulse is given in the presence of a selection gradient $G_z$ (not shown)). Subsequently, an echo pulse ep11 is applied in order to generate a first echo resonance signal as by means of the spin echo pulse sequence described in the U.S. Pat. No. 4,665,367. The excitation pulse ex1 is a 90° pulse and the echo pulse is a 180° pulse, which means that the magnetization M is rotated through 90° and 180°, respectively. An echo resonance signal er11 occurs one echo time TE1 after the application of the excitation pulse ex1. The nuclear spins of the slice d1 then continuously dephase due to the field inhomogeneities of the magnetic field $B_0$. By rephasing the nuclear spins with an echo pulse ep12, a second echo resonance signal er12 is generated, which echo resonance signal occurs one echo time TE2 after the excitation pulse ex1. T2 relaxation is denoted by a broken line. For as long as transverse magnetization still exists, echo resonance signals can be generated by means of echo pulses. The echo resonance signals themselves relax with the previously said relaxation time $T_2^*$ due to the inevitable field inhomogeneities. Depending on the waiting period TR, echo resonance signals can be generated for other slices. Within the waiting period TR, for example 4 slices are excited. ex2 is a (selective) excitation pulse for slice d2, ep21 is a first echo pulse for slice d2. o indicates an interruption of the time axis. The references ex4, ep41, ep42, er41 and er42 denote the excitation pulse, echo pulses and echo resonance signals, respectively, for the slice d4. In order to obtain two resonance signals for each slice, 4 waiting periods are required. By repeating the described pulse sequences for different values of a phase encoding gradient $G_y$ (for example, 256 times) and by sampling the resonance signals obtained (for example, 256 samples per resonance signal), for example 2×16 2D images of the 16 slices can be obtained after grouping and Fourier transformation of the sampling values, which images exhibit mainly T1 contrast and mainly T2 contrast, respectively. The slices need not be successively measured. From a point of view of interference, it is advantageous to measure the slices in a staggered order, for example first the slices d1, d5, d9 and d13 and subsequently the slices d2, d6, d10 and d14, and so on.

Figure 4A:
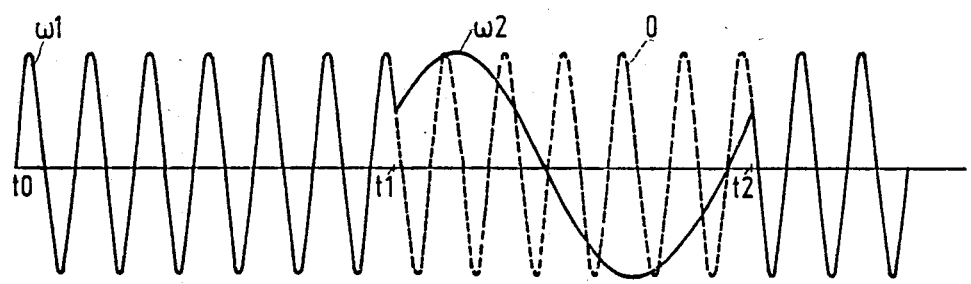
FIG. 4A shows the phase-continuous variation of the frequency of a sinusoidal signal, FIG. 4B further illustrates the phase coherence as used in accordance with the invention.

FIG. 4A shows the phase-continuous variation of the frequency of a sinusoidal signal as a function of the time t. The phase-continuous synthesizer 35 generates a sinusoidal signal having a frequency ω1 at the instant t0. At the instant t1, the frequency becomes ω2. At the instant t2 the frequency is reset to ω1. The interrupted line o indicates that the phase of the sinusoidal signal having a frequency ω1 is phase coherent, during the interval from t0 to t1, with the phase of the sinusoidal signal having the frequency ω1 in the interval after t2. The programmed arithmetic means 60 ensure, in conjunction with the registers 48 and 49, that phase coherence always exists.

Figure 4B:
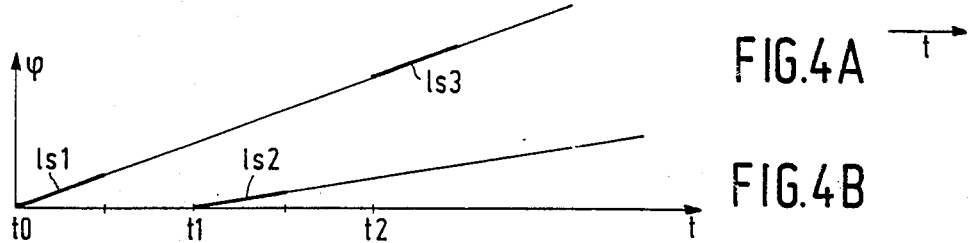

FIG. 4B illustrates phase coherence as used in accordance with the invention. $\phi = \omega \cdot t$ is plotted as a function of the time t for a number of slices. In accordance with the invention, pulse sequences of different slices are interleaved in time. This necessitates phase coherence between excitation pulse, echo pulses and echo resonance signals within each pulse sequence. At the instant t0, a pulse sequence for the slice d1 commences. The heavy line segment ls1 indicates that, for example a 90° excitation pulse for the slice d1 is supplied. At the instant t1, a pulse sequence commences for slice d2 with a 90° excitation pulse, denoted by the line segment ls2. At t2 the pulse sequence for the slice d1 is continued, indicated by the line segment ls3. For example, a 180° echo pulse is applied. It is an essential aspect of the method in accordance with the invention that phase coherence exists between the 90° excitation pulse in ls1 and the 180° echo pulse in ls3. If the phase were not correlated, the Fourier transformation would not produce useful results, because such a transformation is essentially a correlation technique.

FIG. 5 shows a fundamental portion of a cycle of time-interleaved slice-selective pulse sequences in accordance with the invention for two echo resonance signals slice-selective per pulse sequence as a function of the time t. In the example shown, pulse sequences are described for a 2D Fourier zeugmatography. The time t is given in ms. Plotted as a function of the time t are successively: RF electromagnetic pulses hf, a selection gradient $G_z$, a phase encoding gradient $G_y$, a measuring gradient $G_x$, echo resonance signals MR, data gating signals g, and a time axis ts. For the description of the pulses the same notation is used as for the description given with reference to FIG. 3. The pulse sequence 1 spanning from excitation pulse ex1 to the second echo resonance signal er12, for generating echo resonance signals in a first slice is fully illustrated. At t=0 a selective RF electromagnetic excitation pulse ex1 is generated in the transmitter 18. Via the control line 15, the controllable power supply source 11 is activated in order to generate the selection gradient $G_z$ during the pulse ex1. In the transmitter 18 a given bandwidth is imparted to the pulse ex1 by modulation, via the register 38, of the sinusoidal signal generated by means of the phase-continuous synthesizer 35. The bandwidth and the selection gradient $G_z$ are matched in known manner (see, for example Locher page 83). At t=10 ms, a first selective echo pulse ep11 is generated in the transmitter 18. The control line 15 activates $G_z$ again. Dephased nuclear spins rephase at t=20 ms, at which instant a first echo resonance signal er11 arises in the body. Between the excitation pulse ex1 and the echo pulse ep11, $G_y$ is activated, via the control line 14, for the phase encoding of the nuclear spins. Via the control means 12, the amplitude of $G_y$ can be varied. After demodulation in the analog receiver section 19, the echo resonance signal er11 is sampled, during the data gating g11, by means of the analog-to-digital converter 66 (during the data gating g11, for example 256 samples are taken). For frequency encoding, $G_x$ is activated, via the control line 13, during the occurrence of the echo resonance signal er11. $G_x$ is also activated between the pulses ex1 and ep11. At t=80 ms, the transmitter 18 generates a second selective echo pulse ep12, so that a second echo resonance signal er12 occurs at t=140 ms. It is essential that the phase is coherent for the pulse sequence 1, so the phase must be coherent around t=0, t=10 ms, t=20 ms, t=80 ms and t=140 ms. The transmission frequency and the demodulation frequency may differ, but phase coherence is required. The deviation of the transmission frequency and the receiving frequency depends on the transmitter/receiver used. When use is made of a phase-sensitive detector during demodulation, the phase of the excitation pulse ex1 in the pulse sequence 1 is irrelevant. When a digital transmitter/receiver is used, the phase of the excitation pulse is important. All excitation pulses can then have, for example a phase zero. The gradients switched during the pulse sequence 1 are $G_{zex1}$, $G_{x1}$, $G_{y1}$, $G_{zep11}$, $G_{xer11}$, $G_{zep12}$, and $G_{xer12}$. In the present example the echo time of the first echo resonance signal er11 amounts to 20 ms and the echo time of the second echo resonance signal er12 amounts to 140 ms. The time interval between the pulses ex1 and ep11 is used substantially completely for the switching of gradients. The time interval between the pulses ep11 and ep12 and the time interval between the pulse ep12 and the echo resonance signal er12 are not used for that purpose. The latter time intervals are used for pulses and/or resonance signals of other slices. Use is made of the time required for the transverse relaxation time $T_2$ between different echo resonance signals. At t=50 ms, the transmitter 18 generates a selective 90° excitation pulse ex2 of a pulse sequence 2 for a second slice in order to generate a resonance signal (FID, not shown); at t=50 ms, it generates an echo pulse ep21 and at t=130 ms an echo pulse ep22; at t=70 ms, an echo resonance signal er21, the rephased FID signal, arises in the second slice. The further signals of the pulse sequence shown in FIG. 5 are the gradients $G_{zex2}$, $G_{y2}$, $G_{x2}$, $G_{zep21}$, $G_{xer21}$, and $G_{zep22}$, and the data gating signal g21. It is essential that for the pulse sequence 2 the phase is coherent, i.e. around t=50 ms, t=60 ms, t=70 ms and t=130 ms. Because in the time interval between the pulses ep21 and ep22 of the second slice there is also generated, for example the pulse ep12 of the first slice having a different frequency contents (synthesizer 35 generates a different frequency), it is essential that the synthesizer is a phase-continuous synthesizer. FIG. 5 also shows the pulses ep02, ex3 and ep31, the gradients $G_{zep02}$, $G_{xer-12}$, $G_{xer02}$, $G_{zex3}$, $G_{y3}$, $G_{x3}$, $G_{zep31}$ and $G_{xer31}$, and the data gating signals g-12, g02 and g31. There are, for example sequences for 16 slices in each cycle. It will be evident that the pulses, gradients and echo resonance signals of only a few of the 16 slices are shown. For the other slices, the pulse sequences, having an identical composition, simply follow from the described pulse sequences. After two resonance signals have been generated in all slices, the value of the phase encoding gradient $G_y$ is changed via the control means 12. The described pulse sequences are repeated for, for example 256 values of $G_y$. In the embodiment described it is attractive to "expose" nuclear spins to the same gradients during time intervals of a pulse sequence which are used for other pulse sequences. This is done in order to avoid the drawbacks of instrumental deficiencies, such as the difference in the effect of eddy currents. In the present example, for the pulse sequence 1 the time intervals used for other pulse sequences are situated on both sides of the echo pulse ep12. The gradient waveforms of $G_x$, $G_y$ and $G_z$ associated with the other pulse sequences have the same, mirror-image shape with respect to the echo pulse ep12. Furthermore, the conditions in which the various echo resonance signals of a slice are obtained are constant, which means that the measuring gradient $G_x$ has the same sign and the same shape for all echoes of a slice. The same echo times hold good for for all slices. In the present example they amount to 20 ms and 140 ms. The images obtained from the echo resonance signals are thus suitably comparable. For the selected gradient waveforms rephasing occurs exactly at the echo time for an echo resonance signal. For all slices the same sequence of gradient waveforms is chosen. Only the frequency of the synthesizer and the demodulation frequency differ for each slice. When all resonance signals of slices have been generated and processed for a given value of the phase encoding gradient $G_y$, the value of the phase encoding gradient changes so that the rephasing condition is no longer satisfied. In order to restore the rephasing condition, it is necessary to apply a number of dummy sequences. This number depends on the degree of interleaving of the pulse sequences, to be denoted by an interleaving factor I. In the present example $I=1$. For P steps of the phase encoding gradient $G_y$, I.P dummy sequences are required. If $P=256$, 256 dummy sequences are required for $I=1$. This gives rise to a somewhat smaller reduction of the measuring time. In comparison with the known multiple-slice multiple-echo sequence, the reduction of the total measuring time amounts to a reduction factor $R=2.I+1$, so in this case a factor 3. Because of said dummy sequences, this factor will be slightly smaller in practice. The increase in the total measuring time with respect to the ideal reduction is smaller as more slices are measured. In the present example there is a short echo time of 20 ms. In an image to be reconstructed from echo resonance signals mainly $T_1$-contrast becomes manifest. Furthermore, there is a long echo time of 140 ms whereby mainly $T_2$-contrast is achieved. It is to be noted that the interleaving factor I is linked to the difference in echo time. When the difference in echo time is greater, a larger interleaving factor can be selected.

Figure 6:
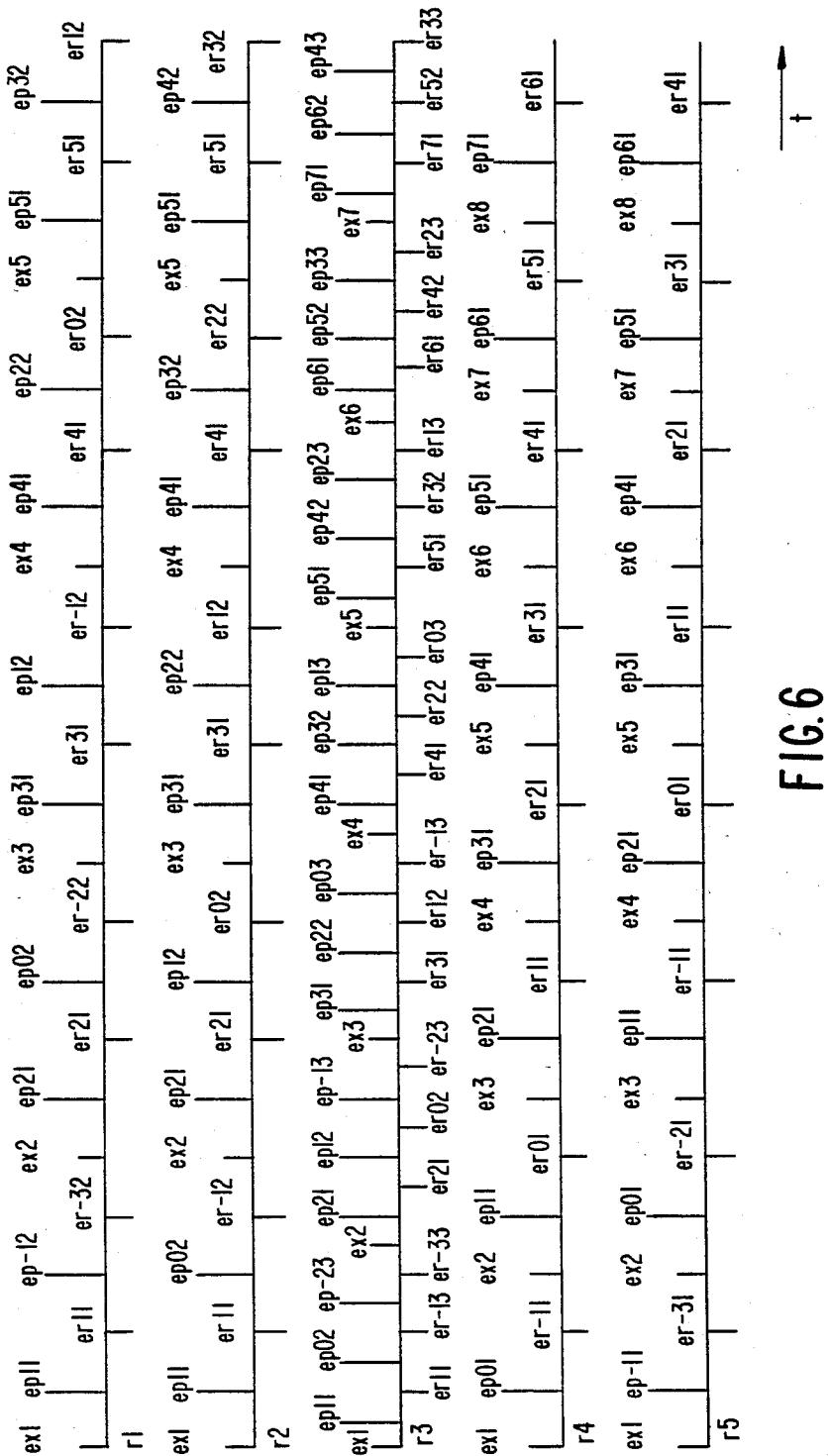

FIG. 6 diagrammatically shows some portions of cycles of time-interleaved slice-selective pulse sequences in accordance with the invention as a function of the time t. For the sake of clarity, only the RF electromagnetic pulses and the echo resonance signals are shown. A short, upwards directed stroke represents a 90° excitation pulse and a long, upwards directed stroke represents a 180° echo pulse; a short downwards directed stroke represents an echo resonance signal. Furthermore, the same notation is used as in FIG. 3. For example, ex1 denotes an excitation pulse, ep11 denotes a first echo pulse, ep12 denotes a second echo pulse, er11 denotes a first echo resonance signal and er12 denotes a second echo resonance signal of a pulse sequence for a first slice. The first line r1 shows pulse sequences where for the interleaving factor $I=2$, so that, ignoring the necessary dummy sequences, a reduction factor $R=5$ is obtained. Two echo resonance signals $E=2$ appear per pulse sequence. On the second line r2, $I=1$, $R=3$ and $E=2$; on the third line r3, $I=1$, $R=3$ and $E=3$; on the fourth line r4, $I=1$, $R=3$ and $E=1$; on the fifth line r5, $I=2$, $R=5$ and $E=1$. The gradients can be switched in the same way as shown in FIG. 5 for 2D Fourier pulse sequences. When the sequences are also repeated while $G_z$ is varied after the 90° excitation pulse in order to achieve phase encoding of the nuclear spins in a second direction, 3D Fourier pulse sequences are formed. The pulse sequences can also be made suitable for 2D and 3D projection reconstruction. $G_x$ and $G_y$ are then simultaneously varied for 2D projection reconstruction after the excitation pulse ex. For 3D projection reconstruction these pulse sequences are also repeated while varying $G_z$ after the 90° excitation pulse. 2D projection reconstruction is described in detail in the cited article by Locher. 3D projection reconstruction is a method derived therefrom. The pulse sequences can be rendered suitable for inversion recovery measurements, being measurements for obtaining information concerning the relaxation time $T_1$. In that case the excitation pulse in each pulse sequence should be preceded by a 180° inversion pulse. It is to be noted that no phase coherence is required between the 180° inversion pulse and the remainder of the pulse sequence, because the 180° inversion pulse does not cause transverse magnetization so that no dephasing/rephasing conditions need be satisfied.

Within the scope of the invention many alternatives will be apparent to those skilled in the art. In order to ensure that within a pulse sequence phase coherence is achieved within a pulse sequence for the time-interleaved pulse sequences, for example use can also be made of more than one synthesizer 35, i.e. one synthesizer for each sub-region to be selected. In that case such a synthesizer need not be phase continuous. The method in accordance with the invention is also carried out by activating, using the control means 12, a multiplex switch connected between the synthesizers 35 and the multiplier device 36 during the generating of the pulse sequences so that the associated synthesizer is activated for each sub-region. When the MRI device comprises such a multiple-synthesizer (for example, 16 synthesizers), the synthesizers may have a digital as well as a conventional analog construction. Such a solution, however, involves substantially more hardware so that this solution is not to be preferred.

What is claimed is:
1. A method of determining a nuclear magnetization distribution from magnetic resonance signals which are generated in plural three-dimensional sub-regions in a body by the application, in the presence of a steady, uniform magnetic field, of cycles of respective plural sub-region-selective sequences of RF electromagnetic field pulses and magnetic field gradient waveforms, in three mutually orthogonal directions, superimposed on said steady, uniform magnetic field, which respective plural sub-region-selective sequences are all applied in each cycle, each sub-region-selective sequence comprising an RF excitation pulse in the presence of a selection gradient waveform associated with said sequence, for selection in a first direction, followed by a phase encoding gradient waveform, which is varied in amplitude, in a second and/or a third direction, from one cycle to the next for phase encoding, followed by one or more RF echo pulses which generate respective one or more echo resonance signals, wherein first and second of said plural sub-region-selective sequences are interleaved in time with each other in that the RF excitation pulse of the second sub-region-selective sequence occurs in the time interval between the RF excitation pulse and the last of said one or more echo resonance signals gener- ated in the first sub-region-selective sequence and wherein within each sub-region-selective sequence said RF excitation pulse and said one or more RF echo pulses are phase coherent with each other.

2. A method as claimed in claim 1, wherein the first of said one or more echo pulses in the second sub-region-selective sequence occurs in the time interval between the RF excitation pulse in the second sub-region-selective sequence and the last echo resonance signal generated in the first sub-region-selective sequence.

3. A method as claimed in claim 1, wherein there are first and second RF echo pulses in each sub-region-selective sequence generating respective first and second echo resonance signals, and wherein the RF excitation pulse, first RF echo pulse and first echo resonance signal generated in the second sub-region-selective sequence occur in the time interval between the second RF echo pulse and the second echo resonance signal generated in the first sub-region-selective sequence.

4. A method as claimed in claim 2, wherein there is only one RF echo pulse in each sub-region-selective sequence generating only one echo resonance signal.

5. A method as claimed in claim 1, wherein one of said one or more RF echo pulses of a third sub-region-selective sequence occurs in the time interval between the between the RF excitation pulse and the last echo resonance signal generated in the first sub-region-selective sequence.

6. A method as claimed in claim 5, wherein all gradient waveforms not associated with the third sub-region-selective sequence which have a dephasing or rephasing effect in the third sub-region-selective sequence are chosen to together have equal and opposite effects respectively preceding and following the said one of the one or more RF echo pulses of the third sub-region-selective sequence.

7. A method as claimed in claim 2, wherein one of said one or more RF echo pulses of a third sub-region-selective sequence occurs in the time interval between the between the RF excitation pulse and the last echo resonance signal generated in the first sub-region-selective sequence.

8. A method as claimed in claim 3, wherein one of said one or more RF echo pulses of a third sub-region-selective sequence occurs in the time interval between the between the RF excitation pulse and the last echo resonance signal generated in the first sub-region-selective sequence.

9. A method as claimed in claim 1 wherein, within a cycle, the gradient waveforms and the times of application of RF echo pulses are the same in the successive time intervals between successive RF excitation pulses.

10. A method as claimed in claim 2 wherein, within a cycle, the gradient waveforms and the times of application of RF echo pulses are the same in the successive time intervals between successive RF excitation pulses.

11. A method as claimed in claim 1 wherein each RF excitation pulse is preceded by an inversion pulse.

12. A method as claimed in claim 10 wherein each RF excitation pulse is preceded by an inversion pulse.

13. A method as claimed in claim 1 wherein the phase encoding gradient waveform is varied in amplitude from one cycle to the next for phase encoding in the second direction.

14. A method as claimed in claim 1 wherein the phase encoding gradient waveform is varied in amplitude in either the second or the third direction from one cycle to the next for phase encoding in both the second and third directions.

15. A method as claimed in claim 1 wherein each cycle begins or ends with a plurality of dummy sequences.

16. A device for determining a nuclear magnetization distribution from magnetic resonance signals to be generated in plural three-dimensional sub-regions in a body comprising: means for generating a steady, uniform magnetic field; means for phase coherent generating of RF electromagnetic field pulses; means for generating field gradient waveforms, in three mutually orthogonal directions, superimposed on said steady, uniform magnetic field; control means for controlling the means for generating the steady uniform magnetic field and for controlling the means for generating field gradient waveforms to cause the application in cycles of respective plural sub-region-selective sequences of RF electromagnetic field pulses and magnetic field gradient waveforms, which respective plural sub-region-selective sequences are all applied in each cycle, each sub-region-selective sequence comprising an RF excitation pulse in the presence of a selection gradient waveform associated with said sequence, for selection in a first direction, followed by a phase encoding gradient waveform, which is varied in amplitude, in a second and/or a third direction, from one cycle to the next for phase encoding, followed by one or more RF echo pulses which generate respective one or more echo resonance signals, wherein first and second of said plural sub-region-selective sequences are interleaved in time with each other in that the RF excitation pulse of the second sub-region-selective sequence occurs in the time interval between the RF excitation pulse and the last of said one or more echo resonance signals generated in the first sub-region-selective sequence and wherein within each sub-region-selective sequence said RF excitation pulse and said one or more RF echo pulses are phase coherent with each other; means for receiving, detecting and sampling the echo resonance signals; and processing means which include programmed arithmetic means for determining the nuclear magnetization distribution from the sampled echo resonance signals.

* * * * *